United States Patent [19]
Cardone

[11] Patent Number: 4,815,962
[45] Date of Patent: Mar. 28, 1989

[54] PROCESS FOR COATING SYNTHETIC OPTICAL SUBSTRATES

[75] Inventor: Paul A. Cardone, Framingham, Mass.

[73] Assignee: Polaroid Corporation, Cambridge, Mass.

[21] Appl. No.: 131,641

[22] Filed: Dec. 11, 1987

[51] Int. Cl.⁴ .......................... B05D 3/06; B05D 5/06
[52] U.S. Cl. ....................................... 427/38; 427/164; 427/248.1; 427/322
[58] Field of Search ...................... 427/38, 39, 40, 164, 427/248.1, 322, 331

[56] References Cited

U.S. PATENT DOCUMENTS

| | | | |
|---|---|---|---|
| 3,713,869 | 1/1973 | Geffcken et al. | 427/164 |
| 3,895,155 | 7/1975 | Shukuri et al. | 427/164 |
| 3,913,520 | 10/1975 | Berg et al. | 427/164 |
| 3,953,652 | 4/1976 | Addiss et al. | 427/164 |
| 4,130,672 | 12/1978 | Onoki et al. | 427/164 |
| 4,143,949 | 3/1979 | Chen | 427/164 |
| 4,161,560 | 7/1979 | Kienel | 427/164 |
| 4,478,873 | 10/1984 | Masso et al. | 427/164 |
| 4,485,124 | 11/1984 | Ciparisso | 427/164 |
| 4,599,272 | 7/1986 | Ichikawa | 427/164 |
| 4,654,231 | 3/1987 | Nyberg et al. | 427/164 |

OTHER PUBLICATIONS

"Ion Beam Processing for Coating MgF₂ Onto Ambient Temperature Substrates", Charles M. Kennemore III and Ursula J. Gibson, Applied Optics, vol. 23, No. 20, Oct. 15, 1984.

"Ion-Assisted Deposition of MgF₂ at Ambient Temperatures", C. J. Gibson and C. M. Kennemore III, Thin Solid Films, 124 (1985), 27–33.

*Primary Examiner*—Sadie Childs
*Attorney, Agent, or Firm*—Francis J. Caufield

[57] ABSTRACT

A process for coating a synthetic resin optical substrate by subjecting the surface of the substrate to low temperature ion bombardment prior to coating in order to open the chemical bonds on the surface of the substrate and coating the substrate surface before the bonds return to their normal or closed condition. The substrate may also be subjected to low temperature ion bombardment during and after coating to further improve coating adherence and abrasion resistance characteristics.

18 Claims, 2 Drawing Sheets

PROCESS FOR COATING SYNTHETIC OPTICAL SUBSTRATES

BACKGROUND OF THE INVENTION

This invention relates to a method and apparatus for coating plastic substrates by vapor deposition and, more particularly, it concerns such a method and apparatus for vapor deposition of optical coatings on the surfaces of optical substrates such as plastic lenses, filters and the like.

Out of problems associated with application of an assortment of coatings to optical substrates, a variety of techniques have evolved in an attempt to increase the quality and adherence of coatings, particularly on synthetic substrates without deleteriously affecting the substrates. For example, vapor polymerization, ion plating and ion assisted deposition techniques have been adopted for improving coating adherence through the use of energized particles.

An example of a vapor polymerization process is disclosed in U.S. Pat. No. 3,713,869 issued to Walter Geffcken et al. The process involves providing a plastic substrate with an intermediate polymerization layer and an outer hard inorganic layer. The polymerization layer is produced by subjecting a low-molecular organic vapor to a glow discharge and depositing the polymerization products on the substrate. The relatively hard inorganic layer is then applied to the polymerized layer by vapor deposition. As pointed out in the text of the Geffcken et al patent, the selection of glow discharge voltages and currents during application of the polymerization layer, as well as the thickness of that layer, are very critical to the achievement of an effective coating.

U.S. Pat. No. 3,913,520 issued to Joseph E. Berg et al discloses an ion plating process for implanting a hard film on plastic substrates by exposing a hard coat material to an electron beam so as to produce ionized molecular particles and using a relatively complex, multi-ring electro-static accelerator to direct the particles to the substrate(s). The respective rings of the accelerator are maintained at varying relatively high potentials modulated with an RF signal.

An example of an ion assisted vapor deposition process is disclosed in U.S. Pat. No. 4,599,272 issued to Hajime Ichikawa. In this process, a synthetic resin substrate is subjected to an argon plasma ion beam during vacuum evaporation of a material containing 10–30% $SiO_2$. Ichikawa discloses that the use of an argon ion beam during coating improves the durability of the evaporated coating by the synergistic action of an ion-bonding effect but indicates that the evaporated coating is likely to peel when the amount of $SiO_2$ is less than 10%.

Another example of an ion assisted deposition process is disclosed in "Ion Beam Processing For Coating $MgF_2$ Onto Ambient Temperature Substrates" by Ursula Gibson and Charles Kennemore III. The process is similar to that disclosed in Ichikawa except that low energy, less than or equal to 250 eV, ions from a controllable ion gun source are used to bombard a plastic substrate during coating to increase adhesion of film without degrading the optical performance of the substrate. The Gibson et al article also mentions that precleaning the substrate by ion bombardment further improves film adhesion.

Although the above-described vapor polymerization, ion plating, and ion assisted deposition processes improve the adherence of coatings to synthetic substrates, there is a need for an improved process by which the adherence of optical coatings on synthetic optical substrates is substantially increased over that attainable using existing processes.

SUMMARY OF THE INVENTION

In accordance with the present invention, a vapor deposition process is provided by which a synthetic optical substrate may be coated in a manner resulting in unexpectedly strong adhesion of a wide variety of coating compositions without upsetting the optical precision of substrate surfaces. The process is applicable to an assortment of heat sensitive optical plastic materials, such as acrylic resins, which have exhibited weak adhesion to coatings in the past.

The process includes a preliminary treatment of substrate workpieces to dislodge all contaminants from the surfaces thereof as well as to open chemical bonds at those surfaces without disrupting underlying bond structure. This treatment is performed by evacuating the chamber in which the workpieces are located, introducing a large molecule, inert gas, such as argon, into the chamber and ionizing the gas to effect an ion bombardment of the workpiece surfaces. Immediately after purging the chamber of the dislodged contaminants, the workpiece surfaces are coated by vapor deposition of a coating evaporant either with or without ion assistance.

A principal object of the present invention is the provision of a coating process which produces optical coatings on synthetic optical substrates with good abrasion and adhesion characteristics without degradation of the optical properties of the substrates. Other objects and further scope of the applicability of the present invention will become apparent from the detailed description to follow, taken in conjunction with the accompanying drawings wherein like parts are designated by like reference numerals

DETAILED DESCRIPTION OF THE PREFERRED EMBODIMENTS

Figure 1:
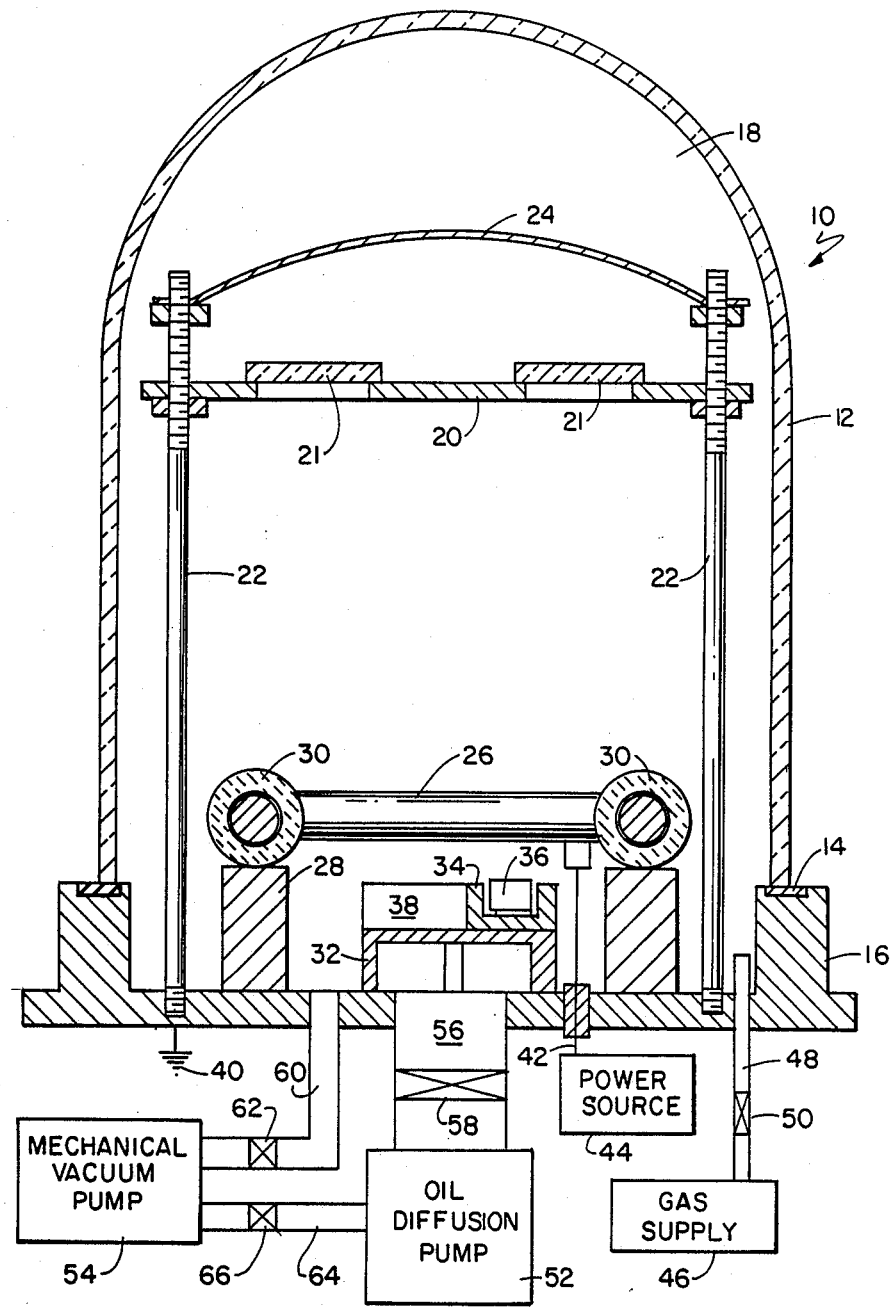
FIG. 1 is a cross section illustrating an exemplary apparatus for use in carrying out the process of the present invention.
Figure 2:
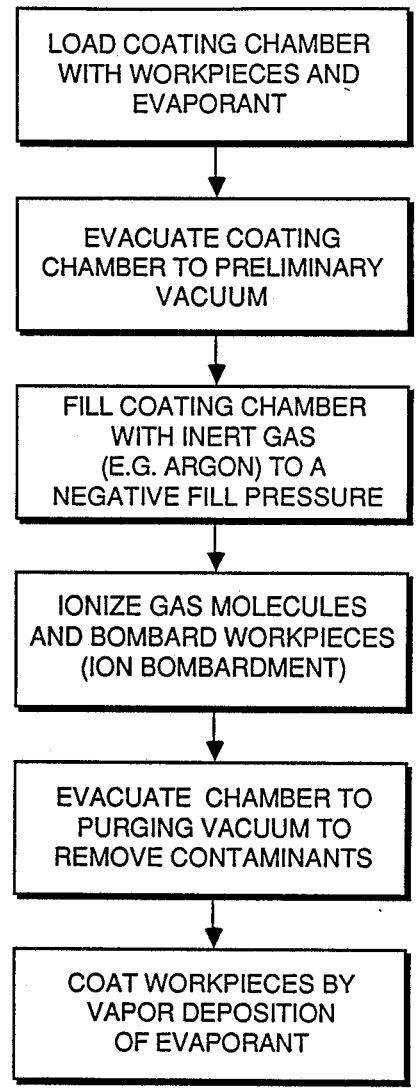
FIG. 2 a is block form flow chart depicting successive steps of the process of the present invention.

An understanding of the method of the present invention may be had by reference to FIG. 1 in which an apparatus for its practice is illustrated in substantially schematic form. In FIG. 1 a coating apparatus is generally designated by the reference numeral 10, and shown to include a bell jar 12 supported at its bottom or open edge on an annular seal 14 of elastomeric material recessed into an upper annular surface of a base 16. The bell jar 12 and the base 16 thus establish a closed coating chamber 18 which may be evacuated to high vacuums in a manner to be described below. A workpiece or substrate holder 20 for retaining a plurality of workpieces 21 is supported in the upper portion of the chamber 18 by a plurality of upstanding conductive rods 22 secured in the base 16 by threaded connection as shown or by other suitable means to ensure electrical conductivity between the rods 22 and the base 16. A collector 24 is positioned in the chamber above the substrate holder 20 and also supported on the rods 22. Near the bottom of the chamber, a ring electrode 26 is supported from an annular support 28 by ring form insulators 30. Under the ring 26, centrally thereof, is a crucible support member 32 positioned on the floor of the base 16 for supporting an evaporant holding crucible 34, an evaporant 36 and an evaporant heater 38. It is preferred that evaporant heater 38 be an electrical resistance element for controllably heating the crucible 34 and/or evaporant material 36, but the heater 38 may also take the form of an electron-beam gun for vaporizing the evaporant material 36 as is well known in the art.

The base 16, substrate holder 20, rods 22 and collector 24 are all formed of electrically conductive materials and are electrically connected to each other. Thus, all of these components may be grounded electrically by connection of the base 16 to an external ground 40. Although the substrate holder 20 is depicted in FIG. 1 as planar, it is contemplated that it may be of inverted dish-shaped configuration or concave in order to provide more surface area opposite the ring electrode 26 and to support a larger number of substrate workpieces equidistantly from the substantially centrally located crucible 34. The collector 24 may take the form of any conductive plate, sheet or foil, such as aluminum foil, which will accept the voltage potential of the holder 20.

The ring electrode 26 is connected by a lead 42 to an external power source 44 capable of charging the ring electrode 26 with either a negative or positive potential in a range including 500 to 3000 volts. Other components of the apparatus located externally of the chamber 18 include a gas supply 46 for supplying an inert gas, such as argon or one of the other Group VIIIA inert gases, to the chamber 18 via a gas supply line 48 and a gas supply control valve 50, and a vacuum pumping system including an oil diffusion vacuum pump 52 and a mechanical vacuum or roughing pump 54.

The oil diffusion vacuum pump 52 communicates with the interior of the chamber 18 through a relatively large diameter pipe 56 and a high vacuum valve 58. The mechanical roughing pump 54 is operatively connected to the coating chamber 18 through a relatively small diameter pipe 60 and a roughing valve 62. Further, the mechanical roughing pump 54 communicates with the oil diffusion pump 52 via a pipe or tube 64 and a foreline valve 66.

While the apparatus 10 illustrated in FIG. 1 may be used to apply coatings by vapor deposition of the evaporant 36 to the workpieces 21 of a wide range of materials, the process of the present invention is concerned principally with coating precision formed surfaces on resinous materials which are sensitive to heat and which traditionally present problems to the adherence of coatings applied to such surfaces thereof. Acrylic lenses, polycarbonate lenses and optical reflectors and filters formed of these materials are examples of workpieces to which the process of the invention is primarily directed. Similarly, the evaporant 36 representing the coating material to be applied to the workpieces 21 may be a wide variety of optical coating materials, traditionally inorganic, and which may include zirconium dioxide, magnesium fluoride, cerium dioxide, aluminum oxide, quartz, aluminum, a mixture of 95% zirconium dioxide and 5% titanium dioxide or a combination of these substances to be applied in sequential coating operations.

With the workpieces 21 and evaporant 36 in place within the chamber 18, the process of the invention is initiated by evacuating the chamber 18 to a preliminary vacuum having a maximum pressure of $2 \times 10^{-5}$ Torr. This evacuation of the chamber 18 is effected by first opening the roughing valve 62 and operating the mechanical vacuum pump 54 until the rate of evacuation drops to an inefficient value. The roughing valve 62 is then closed, the foreline valve 66 is opened and the high vacuum valve 58 opened so that continued evacuation of the chamber 18 is through operation of the oil diffusion pump 52. The chamber is evacuated in this way until the aforesaid preliminary vacuum is attained.

After reaching the preliminary vacuum in the chamber 18, the high vacuum valve 58 is closed to isolate the oil diffusion pump and the gas supply valve 50 opened to fill the coating chamber 18 with argon gas to a first gas fill pressure of between 50 to 100 milliTorr.

The argon gas in the chamber 18 at the first fill pressure is ionized by applying a negative potential of $-500$ to $-3000$ volts to the ring electrode 26 and generate an electric current flow through the ionized gas approximating 100 ma to 200 ma for at least 1½ minutes. Under these conditions, the argon gas ions in the chamber reach an excited state of an intensity to form a visible glow throughout the volume of the chamber 18 under the collector 24 but which is most intense in the region of the electrode 26. Because of the electrically grounded condition of the workpiece holder 20 and of the collector 24, moreover, the excited argon ions migrate from the ring 26 toward the holder to effect a passive bombardment of the workpieces 21. As a result, all oxides, radicals, surface contaminants, etc., which may remain on the workpieces 21 after the preliminary evacuation of the chamber 18, are removed to the ionized atmosphere in the chamber. In addition, the ion bombardment of the plastic workpieces 21 under these conditions operates to open or break up the chemical bonds at the substrate surfaces of the workpieces 21 without disrupting the underlying bond structure of workpiece substrate. This latter action is believed to be due in substantial part to the relatively large size of the argon molecule and its inability to penetrate the surface of the plastic workpiece substrate as compared, for example, with a small particle like an electron which could cause bond damage beneath the substrate surfaces.

As indicated, the duration of the passive ion bombardment of the workpieces 21 should be at least 1½ minutes for the procedure to be effective. It is preferred that the ion bombardment occur for a duration of between 1½ and 3 minutes in the interest of optimizing efficiency of the process. On the other hand, the ion bombardment procedure can continue for up to 15 minutes without any adverse effects on the workpieces 21 due to excessive heating or substrate bond damage.

The location of the grounded collector 24 above the grounded sample holder 20 enhances the effectiveness of the passive ion bombardment step described above. As the charged ions around the electrode 26 repel each other and migrate to ground potential in the region of the substrates 21, the ion concentration in that region is increased due to the presence of the grounded holder 20 and collector 24. This is in contrast to increasing the ion concentration around the substrates 21 by placing the ionization ring or ring electrode 26 closer to the substrates which would also increase unwanted heat and adversely effect the substrates.

Immediately following the time period during which the described voltage potential is applied to the ring 26, the chamber 18 is evacuated to a purging vacuum having a maximum pressure of $2\times10^{-5}$ Torr. This purging vacuum is attained by opening the high vacuum valve 58 and operating the oil diffusion pump 52. As a result of the purging vacuum, all of the liberated oxides, radicals and contaminants are removed from the coating chamber.

After purging the chamber 18 of all contaminates and closing the vacuum valves 58 and 62, a workpiece coating procedure may be initiated by admitting argon from the supply 46, using the valve 50, to the chamber 18 until pressure in the chamber reaches between 8 and $9\times10^{-5}$ Torr.

While maintaining this pressure, the crucible heating element 38 is energized to heat the crucible 34 and evaporate the evaporant material 36. During this coating procedure, the electrode 26 may be charged or not depending on the particular case. The vapor form coating material fills the argon rich atmosphere in the chamber and condenses as a film or coating on the workpieces 21 in a manner well known in the art.

In order that adherence of the thus deposited coating of the evaporant 36 on the substrate surfaces of the workpieces 21 benefit from the passive ion bombardment, which occurred prior to purging the chamber 18 of contaminants, it is important that the coating procedure be initiated before the opened chemical bonds at the surfaces of the of the workpiece substrates return to a normal or "closed" condition. It has been found through experimentation with acrylic and polycarbonate substrates, that coating adherence attributable to the opened surface bonds will occur where the coating procedure is initiated within approximately 20 minutes after passive ion bombardment of the workpieces 21 has occurred.

A preferred alternative to the aforementioned coating procedure is to fill the coating chamber 18 with fresh argon to a pressure of about $3\times10^{-4}$ Torr and charge the ring electrode 26 to a negative potential of $-1000$ to $-3000$ volts and maintain that potential throughout the coating procedure. By maintaining the ring electrode at such a potential while heating the crucible 34 to evaporate the evaporant material 36, the argon gas within the coating chamber is ionized and maintained in an excited state. As a result, the previously opened chemical bonds on the surface of the workpiece substrates remain open to increase the adhesion of the coated material on the substrate surfaces. Since the pressure within the coating chamber is maintained at $3\times10^{-4}$ Torr the coating deposition rate tends to be reduced from that which is possible at a lower chamber pressure. On the other hand, the grounded support 20 and collector 24 tend to minimize this reduced coating deposition rate by eliminating the possibility of a space charge buildup which would repel oppositely charged coating particles. By so providing a path for charge removal, the density of coating particles in the vicinity of the workpieces 21 is increased.

It is contemplated that the coating sequence could be followed by a post-coating low temperature ion bombardment step wherein the coating chamber 18 is back filled with argon gas to a pressure of about $1\times10^{-2}$ Torr and the argon gas is ionized by applying a negative potential of $-1500$ volts to the ring electrode 26 for approximately thirty minutes. This post-coating ion bombardment step imparts film strength and bonding strength to the coatings on the substrates 21 through energy transfer.

A more complete understanding of and appreciation for the process of the present invention may be had from the following test results obtained by using an apparatus similar to the coating apparatus 10 described with reference to FIG. 1.

Abrasion testing (Atlas Crockmeter with linen pad at 800 gm pressure) indicated a significant improvement in abrasion resistance of samples coated by the aforesaid process. The evaluation of abrasion resistance is measured by a percent loss of coating per number of strokes. In one such test, at 5 strokes, an acrylic sample coated with magnesium fluoride as previously described lost only 10% of its coating compared to a control sample (coated without any argon ionization) which lost 100% of its coating. In addition, the test sample showed no separation of the coating from the substrate by the traditional "tape test", while the control sample exhibited total separation of the coating from the substrate by the "tape test".

Thus, it will be appreciated that as a result of the present invention, a highly effective and improved process for the adhesion of optical coatings to synthetic optical substrates is provided by which the principal objective, among others, is completely fulfilled. It is contemplated and will be apparent to those skilled in the art from the preceding description and accompanying drawings, that modifications and/or changes may be made in the illustrated embodiments without departure from the present invention. Accordingly, it is expressly intended that the foregoing description and accompanying drawings are illustrative of preferred embodiments only, not limiting, and that the true spirit and scope of the present invention be determined by reference to the appended claims.

I claim:

1. In a process for vapor deposition coating a heat sensitive synthetic resin substrate surface having a plurality of chemical bonds, the improvement wherein prior to vapor deposition coating of the substrate, the process comprises the step of:
    opening at least some of the chemical bonds on the surface of the substrate by passive bombardment of the surface with ions of a relatively large molecule inert gas.

2. The process of claim 1, further comprising:
    coating the substrate by vapor deposition while at least some of the chemical bonds are still open.

3. A process for coating a synthetic resin substrate surface having a plurality of chemical bonds, comprising the steps of:
    subjecting the surface of the substrate to a low temperature bombardment of ions of an inert gas for a period sufficient to open the chemical bonds on the substrate surface; and
    coating the open-bonded substrate surface.

4. The process of claim 3, wherein said coating is an optical coating.

5. The process of claim 3, wherein said inert gas is a Group VIIIA gas.

6. The process of claim 3, wherein said inert gas is argon.

7. The process of claim 3, further comprising:
    subjecting said substrate surface to low temperature ion bombardment during coating.

8. The process of claim 7, further comprising:
    subjecting said substrate surface to ion bombardment after coating.

9. A process for coating optical surfaces on synthetic resin workpieces, said process including the steps of:
loading the workpieces and a coating evaporant in a closed chamber;
evacuating the chamber to a preliminary vacuum;
filling the chamber with a large molecule inert gas to a negative fill pressure;
ionizing the gas to effect ion bombardment of the optical surfaces under conditions to dislodge contaminants and open chemical bonds at said surfaces without disrupting the bond structure of the workpieces below said surfaces;
evacuating the chamber to a purging vacuum to remove contaminants dislodged from the workpieces during said ion bombardment step; and
coating the optical surfaces by vapor deposition of the coating evaporant within a short period of time after said ion bombardment step.

10. The process of claim 9, wherein the inert gas in a Group VIIIA gas.

11. The process of claim 9, wherein said ionizing step is performed by subjecting the gas in said chamber to a voltage potential of about 500 to 3000 volts.

12. The process of claim 11, wherein said ion bombardment step is continued for at least 1½ minutes.

13. The process of claim 12, wherein said negative fill pressure is in the range of 50 to 100 milli-Torr during said ion bombardment.

14. The process of claim 9, wherein said coating step is performed within approximately 20 minutes after said ion bombardment step.

15. The process of claim 9, wherein the workpieces are maintained at substantially ground potential at least during said ionizing and coating steps.

16. A process for applying an optical coating to the surface of a synthetic optical substrate, the process being carried out in a coating chamber and comprising the steps of:
(a) evacuating the coating chamber by reducing the pressure within the coating chamber to about $2 \times 10^{-5}$ Torr or less;
(b) back-filling the coating chamber with argon gas to a pressure of about 50 to 100 milli-Torr;
(c) ionizing the argon gas with a negative potential of $-500$ to 3000 volts for about 1½ to 3 minutes;
(d) purging the coating chamber by reducing the chamber pressure to about $2 \times 10^{-5}$ Torr;
(e) back-filling the chamber with fresh argon gas to a pressure of about 8 to $9 \times 10^{-5}$ Torr; and,
(f) coating the substrate by vapor deposition of an evaporant coating material.

17. A process for applying an optical coating to a surface of a synthetic optical substrate, the process being performed within a coating chamber and comprising the steps of:
(a) evacuating the coating chamber by reducing the pressure within the coating chamber to about $2 \times 10^{-5}$ Torr or less;
(b) back-filling the coating chamber with argon gas to a pressure of about 50 to 100 milli-Torr;
(c) ionizing the argon gas with a negative potential of $-500$ to $-3000$ volts for about 1½ to 3 minutes;
(d) purging the coating chamber by reducing the chamber pressure to about $2 \times 10^{-5}$ Torr;
(e) back-filling with fresh argon gas to a pressure of about $3 \times 10^{-4}$ Torr; and,
(f) ionizing the argon gas with a negative potential of about $-1000$ to $-3000$ volts during vapor deposition of an evaporant coating material.

18. A process for applying an optical coating to a surface of a synthetic optical substrate while the substrate is within a coating chamber, comprising the steps of:
(a) reducing the pressure within the coating chamber to about $2 \times 10^{-5}$ Torr or less;
(b) back-filling with argon gas to a pressure of about $50 \times 10^{-3}$ Torr;
(c) ionizing the argon gas with a negative potential of about a $-500$ volts for at least 1½ minutes;
(d) reducing the pressure to about $8 \times 10^{-6}$ Torr or less;
(e) evaporating a coating material;
(f) back-filling the chamber with argon gas to a pressure of about $1 \times 10^{-2}$ Torr; and,
(g) ionizing the argon gas with a negative potential of about $-500$ volts for approximately 30 minutes.

* * * * *